United States Patent [19]

Tomita

[11] Patent Number: 4,642,483
[45] Date of Patent: Feb. 10, 1987

[54] REVERSE BIAS CURRENT SUPPLY SYSTEM FOR A SWITCHING DEVICE

[75] Inventor: Hiroo Tomita, Kawasaki, Japan

[73] Assignee: Fuji Electric Company Ltd., Kawasaki, Japan

[21] Appl. No.: 660,202

[22] Filed: Oct. 12, 1984

[51] Int. Cl.[4] .......................... H03K 19/08; H03K 3/26
[52] U.S. Cl. .................................. 307/300; 307/252 C; 307/96 R; 307/318
[58] Field of Search .................... 307/315, 300, 252 C, 307/296 R, 318

[56] References Cited

U.S. PATENT DOCUMENTS

| | | | |
|---|---|---|---|
| 4,117,351 | 9/1978 | Kalfus et al. | 307/315 |
| 4,239,989 | 12/1980 | Brajder | 307/300 |
| 4,293,779 | 10/1981 | Nestler et al. | 307/252 C |
| 4,298,809 | 11/1981 | Onda et al. | 307/252 C |
| 4,426,590 | 1/1984 | Rischmuller | 3071/315 |

Primary Examiner—Stanley D. Miller
Assistant Examiner—B. P. Davis
Attorney, Agent, or Firm—Spencer & Frank

[57] ABSTRACT

A reverse bias current supply system for a switching device having a circuit including a constant voltage device connected in parallel with an electrical circuit which supplies a base reverse bias current to the switching semiconductor device so that a voltage across the electrical circuit is clamped to control the base reverse bias current at a constant level regardless of variations in the power supply or component characteristics.

15 Claims, 4 Drawing Figures

REVERSE BIAS CURRENT SUPPLY SYSTEM FOR A SWITCHING DEVICE

BACKGROUND OF THE INVENTION

1. Field of the Invention

The present invention relates to a reverse bias current supply system for a switching device for supplying a base reverse bias current to a switching semiconductor device such as a switching power transistor that is rendered conductive so that the switching device is interrupted.

2. Description of the Prior Art

When a power transistor which is conductive is interrupted or turned off, it is usual that a base reverse bias current (hereinafter referred to as $I_{B2}$) is supplied to the transistor in order to obtain good switching characteristics. It is known that when the value of the base reverse bias current $I_{B2}$ is increased, the safe operating region in which the base reverse bias is supplied to the power transistor is narrowed.

FIG. 1 is a graph illustrating an example of such a safe operating range. The vertical axis in FIG. 1 represents the collector current $I_C$ of a power transistor, and the horizontal axis represents the collector voltage $V_{CE}$.

As can be understood from FIG. 1, when a collector current $I_C$ of 30 A is controlled in a case in which the base reverse bias current $I_{B2}$ is 3 A, there is the possibility that the power transistor may be damaged if the surge collector voltage $V_{CE}$ is 300 V or less. Furthermore, if the base reverse bias current $I_{B2}$ is increased to 6 A, there is the possibility that the power transistor may be damaged if the surge collector voltage $V_{CE}$ is 260 V or less to control the same collector current $I_C$ of 30 A. This means that the safe operating range is reduced from the solid line to the dash and dotted line.

As can also be understood from the above example, when the base reverse bias current $I_{B2}$ varies in this manner, the safe operating range for the power transistor also varies. Accordingly, it is desirable to control the value of the base reverse bias current $I_{B2}$ in such a way that good switching characteristics are obtained while the safe operating range is not narrowed.

Hitherto, however, limitations principally of cost and dimensions have generally prevented particular control of the base reverse bias current. For this reason, in the methods adopted to deal with variations in the base reverse bias current $I_{B2}$ caused by such factors as variations in the power supply to the base reverse bias circuit and variations in component characteristics, the switching characteristics are checked at the minimum value of imaginary variations in the base reverse bias current $I_{B2}$ under given working conditions, and also the safe operating range is checked at the maximum value of the imaginary variations in the base reverse bias current $I_{B2}$. If both the checkings are cleared, the base reverse bias current is accepted. Consequently, because of the need to make a trade off between the switching characteristics of the power transistor and the safe operating range which depend on this base reverse bias current $I_{B2}$, a switching power transistor has not necessarily been used under a condition of its maximum performance.

SUMMARY OF THE INVENTION

It is, therefore, an object of the present invention to provide a reverse bias current supply system for a switching semiconductor device which controls the value of the base reverse bias current to a fixed current level in such a manner that a sufficient safe operating range is secured while good switching characteristics are ensured in a semiconductor switching device such as a power transistor.

It is another object of the present invention to provide a reverse bias current supply system for a switching device having a circuit including a constant voltage device connected in parallel with an electrical circuit which supplies a base reverse bias current to the switching semiconductor device so that the voltage across the electrical circuit is clamped to control the base reverse bias current at a constant level regardless of variations in the power supply or component characteristics.

A system for supplying a base reverse bias current to a switching semiconductor device in accordance with the present invention comprises first means receiving a switching signal and including a path for a control current for switching the switching semiconductor device for supplying the control current to the switching semiconductor device through the path; second means receiving the switching signal for controlling the switching semiconductor device to supply a base reverse bias current to the switching semiconductor device through a portion of the path of the first means when the switching signal is interrupted; and third means having a circuit including a constant voltage device which is connected in series to the first means through which the base reverse bias current flows for clamping a voltage across the circuit to control the base reverse bias current substantially at a fixed level.

The constant voltage device may be a Zener diode. It is preferable that the circuit in the third means has a series connection of the Zener diode and a diode in reverse polarity. Here, one terminal of the Zener diode may be connected to the control input terminal of the switching semiconductor device.

The first means can include a resistor for limiting the base reverse bias current. The second means can include a transistor inserted into the path of the first means and the transistor controls the supply of the base reverse bias current in response to the switching signal. The switching semiconductor device can be formed by Darlington connection transistors or a gate-turn-off thyristor.

DETAILED DESCRIPTION OF THE PREFERRED EMBODIMENTS

Before explaining an embodiment of the present invention with reference to the drawings, a detailed explanation will be made of an example of a conventional system for supplying a base reverse bias current to a switching semiconductor device.

Figure 1:
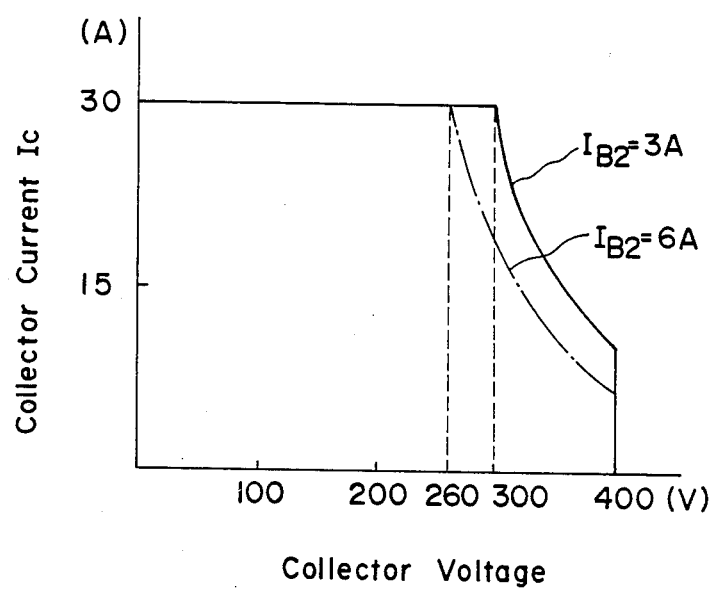
FIG. 1 is a graph illustrating an example of a safe operating range when a base reverse bias current is supplied to a power transistor.
Figure 2:
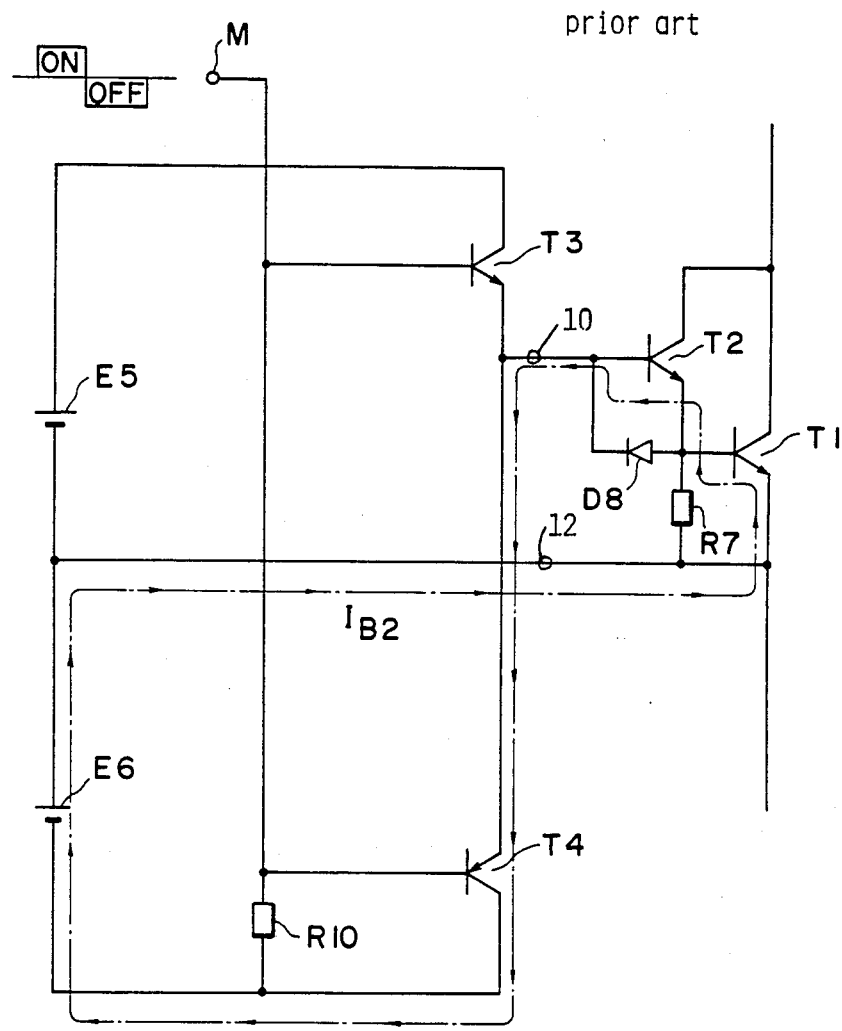
FIG. 2 is a circuit diagram showing an example of a conventional system for supplying a base reverse bias current to a switching semiconductor device.

FIG. 2 shows an example of such a conventional reverse bias current supply system. In FIG. 2, $T_1$ denotes a main transistor, $T_2$ is an auxiliary transistor. Both transistors $T_1$ and $T_2$ are connected in a Darlington connection fashion to form a power switching transistor having a first terminal 10 connected to the base of the auxiliary transistor $T_2$ and a second terminal $T_2$ connected to the emitter of the main transistor $T_1$, respectively. $T_3$ is a forward bias transistor. $T_4$ is a reverse bias transistor. $E_5$ is a forward bias power supply. $E_6$ is a reverse bias power supply. $R_7$ and $R_{10}$ are resistors. $D_8$ is a diode. M is a control signal input terminal. The resistor $R_7$ and the diode $D_8$ form a path for a base reverse bias current after the transistors $T_1$ and $T_2$ are interrupted. This diode $D_8$ is used to extract base carriers from the main transistor $T_1$, and the resistor $R_7$ is used to increase voltage resistance between the emitter and the collector of the transistor $T_1$.

The operation will now be explained. When an ON signal is inputted via the control signal input terminal M, the forward bias transistor $T_3$ is rendered conductive and a forward bias current flows from the forward bias power supply $E_5$ to the transistors $T_1$ and $T_2$ through the transistor $T_3$, so that these transistors $T_2$ and $T_1$ turn on.

Next, when an OFF signal is inputted through the control signal input terminal M, the forward bias transistor $T_3$ is interrupted, and the reverse bias transistor $T_4$ is rendered conductive, so that the reverse bias current $I_{B2}$ flows from the reverse bias power supply $E_6$ along the path shown by the dash and dotted line. First, the auxiliary transistor $T_2$ turns off and the reverse bias current $I_{B2}$ flows from the auxiliary transistor $T_2$ to the diode $D_8$. Next, the main transistor $T_1$ turns off and then the reverse bias current $I_{B2}$ flows from the main transistor $T_1$ to the resistor $R_7$.

In this manner, when a power transistor is turned off, it is usual that a base reverse bias current is supplied to the transistor in order to obtain good switching characteristics. As described above, however, the base reverse bias current is not controlled, and the methods adopted to deal with variations in the base reverse bias current $I_{B2}$ due to such factors as variation in the power supply to the base reverse bias circuit and variations in component characteristics, have included the checking of the switching characteristics at the minimum value of imaginary variations in the base reverse bias current $I_{B2}$ under working conditions, and the checking of the safe operating range at the maximum value of the imaginary variations in the base reverse bias current $I_{B2}$. Then, if both the checkings are cleared, the base reverse bias current is accepted.

Figure 3:
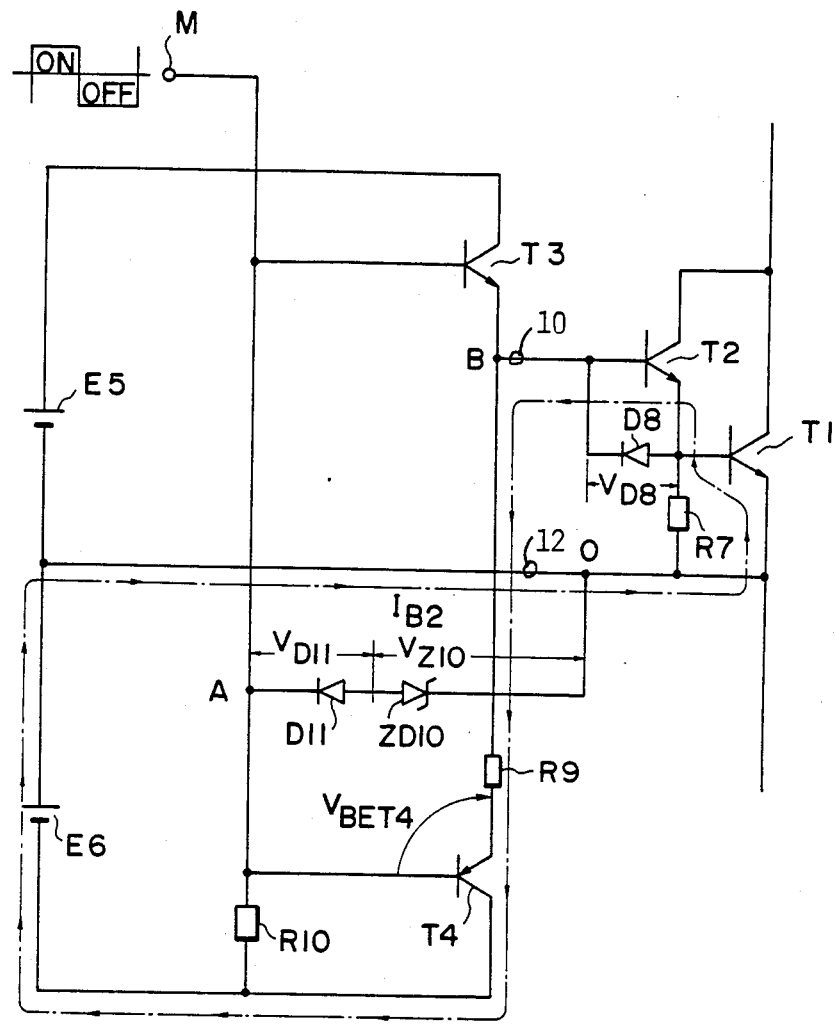
FIG. 3 is a circuit diagram showing an embodiment of a reverse bias current supply system for a switching device in accordance with the present invention.

FIG. 3 shows an embodiment of a reverse bias current supply system for a switching device in accordance with the present invention. The circuit configuration shown in FIG. 3 is different from the conventional circuit shown in FIG. 2 in the following arrangement. That is, a series circuit in which a diode $D_{11}$ and a Zener diode $ZD_{10}$ are connected in series in a reverse polarity fashion is connected between points A and O. A resistor $R_9$ is inserted into the path for the base reverse bias current on the emitter side of the reverse bias transistor $T_4$. This resistor $R_9$ limits the base reverse bias current $I_{B2}$.

The series circuit containing the Zener diode $ZD_{10}$ and the diode $D_{11}$ clamps the base potential of the reverse bias transistor $T_4$ (the potential at point A) at a fixed value with respect to the common potential (the potential at point O, that is, the emitter potential of the main transistor $T_1$).

Now, it is assumed that the reverse bias current $I_{B2}$ flows through the path shown by the dash and dotted line, so that the transistors $T_1$ and $T_2$ turn off after having been conductive. Under these conditions, the following three transient operating modes are considered.

(A) When both transistors $T_1$ and $T_2$ are not interrupted yet, and carriers remain in the base:

$$I_{B2}\omega[(V_{Z10}+V_{D11}-V_{BET4})/R_g] \qquad (1)$$

(B) When the transistor $T_2$ is already interrupted, but the transistor $T_1$ is not interrupted yet:

$$I_{B2}\omega[(V_{Z10}+V_{D11}-V_{BET4}-V_{D8})/R_9] \qquad (2)$$

(C) After both the transistors $T_1$ and $T_2$ are interrupted:

$$I_{B2}\omega[(V_{Z10}+V_{D11}-V_{BET4}-V_{D8})/R_9+R_7] \qquad (3)$$

Here, $V_{Z10}$: Zener voltage of the Zener diode $ZD_{10}$
$V_{D11}$: Forward voltage drop of the diode $D_{11}$
$V_{BET4}$: Base-emitter voltage of the transistor $T_4$
$R_9$: Resistance of the resistor $R_9$
$V_{D8}$: Forward voltage drop of the diode $D_8$
$R_7$: Resistance of the resistor $R_7$ In the above equations (1)–(3), the values of $V_{Z10}$, $V_{D11}$, $V_{BET4}$, $V_{D8}$, $R_9$ and $R_7$ are all fixed, so that it should be clear that the reverse bias current $I_{B2}$ is maintained at a constant level irrespective of the variation of the power supply voltage. Furthermore, since both $V_{D11}$ and $V_{BET4}$ have positive temperature coefficients, the value of $(V_{D11}-V_{BET4})$ is substantially constant regardless of temperature variations, so that the reverse bias current $I_{B2}$ is kept at a substantially constant level irrespective of temperature variations.

The reverse bias current $I_{B2}$ is given by equations (1) and (2), when the transistor switching characteristics and the safe operating range become critical, that is, when the transistors $T_1$ and $T_2$ are interrupted. If the values of the Zener voltage $V_{Z10}$ and the resistance $R_9$ are determined appropriately, good switching characteristics can be obtained, without being influenced by variations in power supply voltage or temperature, and a reverse bias current $I_{B2}$ can be established that keeps the safe operating range at the maximum.

Further, the cathode of the Zener diode $ZD_{10}$ may be connected to point B on the base side of the auxiliary transistor $T_2$ in order to achieve the same effect. The reason follows. Carriers remain in the transistors $T_1$ and $T_2$ until the transistors $T_1$ and $T_2$ are interrupted completely, so that these transistors $T_1$ and $T_2$ are conductive backward, and accordingly the emitters and the bases of the transistors $T_1$ and $T_2$ have substantially equal potential. In this case, the reverse bias current $I_{B2}$ is clamped at the same level both before and after carriers have been exhausted from the main transistor $T_1$. However, since it is preferable that the reverse bias current $I_{B2}$ is lower after the carriers have been exhausted from the main transistor $T_1$ because of smaller loss, the circuit arrangement shown in FIG. 3 is better from this point of view.

Figure 4:
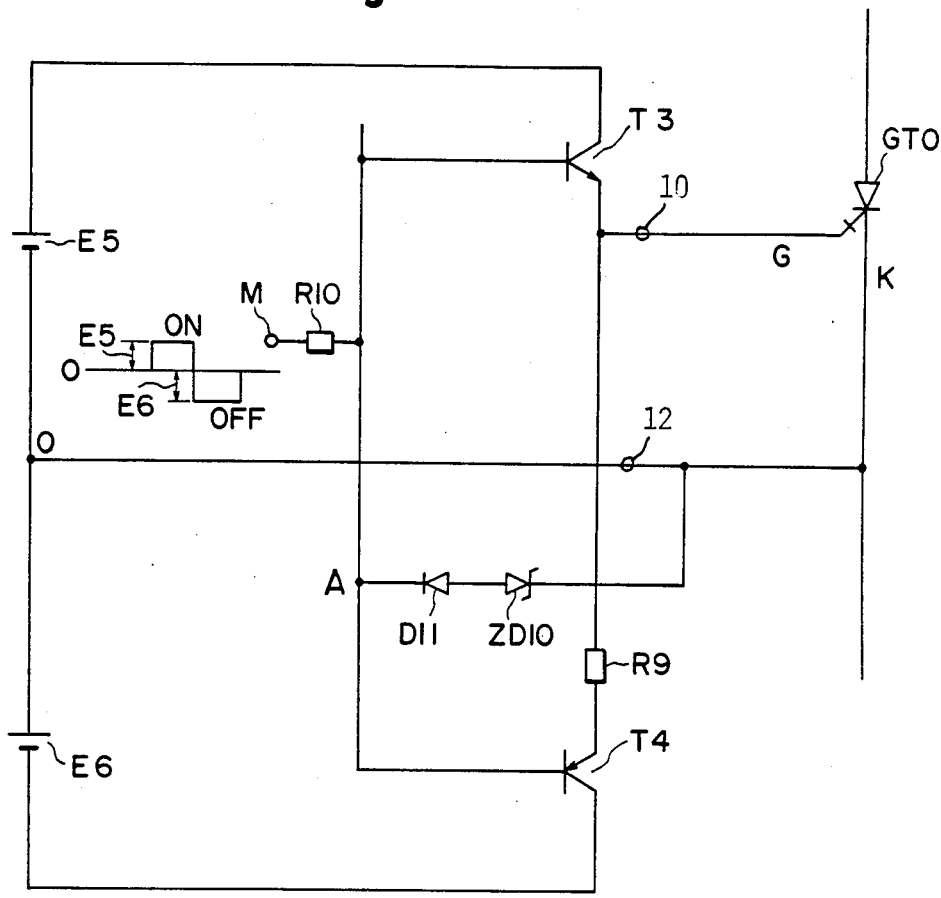
FIG. 4 is a circuit diagram showing a second embodiment of a reverse bias current supply system for a switching device in accordance with the present invention.

FIG. 4 shows a second embodiment of the present invention. In FIG. 4, a gate turn-off thyristor GTO is used as the switching semiconductor device instead of a transistor. In this case, the bases and emitters of the transistors $T_1$ and $T_2$ in FIG. 3 correspond, respectively, to the gate G and the cathode K of the thyristor GTO in FIG. 4. Since the operation of this circuit is the same as in FIG. 3, there is no need to explain the circuit shown in FIG. 4.

According to the present invention, it is possible with a simple configuration to control the base reverse bias current $I_{B2}$ at a constant value substantially regardless of variations in power supply voltage and temperature, so that the reverse bias current can be determined at the maximum value to be permitted by the safe operating range, and accordingly a switching device can be operated always with its best switching characteristics.

Further, the present invention is not limited to the base reverse bias circuit of Darlington connected transistors or the turn-off circuit of a GTO thyristor as described above, but can also be widely applied to a single transistor.

What is claimed is:

1. A system for supplying a base reverse bias current to a switching semiconductor device having a turn-off period, comprising:
   first means receiving a switching signal and including a path for a control current for switching said switching semiconductor device, said first means supplying said control current to said switching semiconductor device through said path;
   second means receiving said switching signal for controlling said switching semiconductor device, said second means supplying a base reverse bias current to said switching semiconductor device through a portion of said path of said first means when said switching signal is interrupted; and
   third means having a circuit including a constant voltage device connected in series with said first means through which said base reverse bias current flows for clamping a voltage across said circuit to control said base reverse bias current substantially at a fixed level during the turn-off period of said switching semiconductor device.

2. A system for supplying a base reverse bias current to a switching semiconductor device as claimed in claim 1, wherein said constant voltage device is a Zener diode.

3. A system for supplying a base reverse bias current to a switching semiconductor device as claimed in claim 2, wherein said circuit in said third means comprises a series connection of said Zener diode and a diode, said Zener diode and said diode being connected with reverse polarity with respect to each other.

4. A system for supplying a base reverse bias current to a switching semiconductor device as claimed in claim 3, wherein one terminal of said Zener diode is connected to the control input terminal of said switching semiconductor device.

5. A system for supplying a base reverse bias current to a switching semiconductor device as claimed in claim 1, wherein said first means includes a resistor for limiting said base reverse bias current.

6. A system for supplying a base reverse bias current to a switching semiconductor device as claimed in claim 1, wherein said second means includes a transistor in the path of said first means and said transistor controls the supply of the base reverse bias current in response to said switching signal.

7. A system for supplying a base reverse bias current to a switching semiconductor device as claimed in claim 1, wherein said switching semiconductor device is formed by Darlington connection transistors.

8. A system for supplying a base reverse bias current to a switching semiconductor device as claimed in claim 1, wherein said switching semiconductor device is a gate-turn-off thyristor.

9. A circuit for supplying a base reverse bias current to a switching semiconductor device having at least first and second terminals, said base reverse bias current being supplied to said device during a turn-off period immediately following application of an OFF signal thereto, comprising
   first and second transistors each having first, second and third electrodes, said first and second transistors being of opposite conductivity types;
   first means for selectively coupling an ON signal and said OFF signal to the first electrodes of said first and second transistors;
   second means coupling the second electrodes of said first and second transistors to the first terminal of said switching semiconductor device;
   third means coupling the third electrodes of said first and second transistors through first and second voltage sources to the second terminal of said switching semiconductor device; and
   fourth means coupling the first electrodes of said first and second transistors to one of said first and second terminals of said switching semiconductor device, said fourth means comprising a series-connected first diode and Zener diode polarized to conduct current in opposite directions, whereby said diode and Zener diode maintains said base reverse bias current at a substantially constant level.

10. A circuit as claimed in claim 9 wherein the first, second and electrodes of said first and second transistor are base, emitter and collector electrodes respectively.

11. A circuit as claimed in claim 9 wherein a first resistor is coupled between the first terminal of said switching semiconductor device and the second electrode of said second transistor.

12. A circuit as claimed in claim 11 wherein said switching semiconductor device comprises third and fourth transistor each having base, emitter and collector electrodes; a second resistor coupled between the base and emitter electrodes of said third transistor; a second diode coupled between the base electrodes of said third and fourth transistors; and means coupling the collector electrodes of said third and fourth transistors, the base electrode of said third transistor to the emitter electrode of said fourth transistor, the emitter electrode of said third transistor to said second terminal and the base electrode of said fourth transistor to said first terminal.

13. A circuit as claimed in claim 11 wherein said switching semiconductor device comprises a gate turn-off thyristor having a gate electrode connected to said first terminal and a cathode electrode connected to said second terminal.

14. A circuit as claimed in claim 12 wherein the first and second electrodes of said first and second transistors are base, emitter and collector electrodes respectively.

15. A circuit as claimed in claim 13 wherein the first and second electrodes of said first and second transistors are base, emitter and collector electrodes respectively.

* * * * *